US009835690B2

(12) United States Patent
Huang et al.

(10) Patent No.: US 9,835,690 B2
(45) Date of Patent: Dec. 5, 2017

(54) AC INRUSH CURRENT TESTING DEVICE

(71) Applicant: Chicony Power Technology Co., Ltd., New Taipei (TW)

(72) Inventors: Wen-Nan Huang, New Taipei (TW); Ming-Tsan Lin, New Taipei (TW); Ching-Guo Chen, New Taipei (TW); Shiu-Hui Lee, New Taipei (TW); Chih-Ming Yu, New Taipei (TW); Hsin-Chang Yu, New Taipei (TW); Chang-Li Hsieh, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 39 days.

(21) Appl. No.: 14/885,655

(22) Filed: Oct. 16, 2015

(65) Prior Publication Data

US 2017/0108557 A1    Apr. 20, 2017

(51) Int. Cl.
*G01R 31/42* (2006.01)
(52) U.S. Cl.
CPC .................................... *G01R 31/42* (2013.01)
(58) Field of Classification Search
None
See application file for complete search history.

(56) References Cited

U.S. PATENT DOCUMENTS 3,558,983 A * 1/1971 Steen ...................... H02H 3/08
                                                    361/58
4,333,122 A * 6/1982 Hayden .................. H02H 3/093
                                                    361/114
6,954,408 B2   10/2005 Hsu et al.

FOREIGN PATENT DOCUMENTS

| CN | 1321351 A    | 11/2001 |
| CN | 101051205 B  | 1/2011  |
| EP | 0 284 541 A2 | 2/2011  |
| TW | I337259 B    | 2/2011  |

* cited by examiner

*Primary Examiner* — Paresh Patel
(74) *Attorney, Agent, or Firm* — Muncy, Geissler, Olds & Lowe, P.C.

(57) ABSTRACT

An AC inrush current testing device is disclosure. The AC inrush current testing device includes a grid voltage peak point calculator, a grid voltage period and timing detector, a switch, an autotransformer, and a main relay. The grid voltage period and timing detector is connected to an AC power source and the grid voltage peak point calculator. A movable contact of the switch is connected to the AC power source. A first winding of the autotransformer is connected to the AC power source, a second winding of the autotransformer, and a first stationary contact of the switch. A third winding of the autotransformer is connected to a second stationary contact of the switch and the second winding. The main relay is electrically connected to the grid voltage peak point calculator, the second winding, and the third winding. A method for testing AC inrush current is further disclosed.

7 Claims, 2 Drawing Sheets

AC INRUSH CURRENT TESTING DEVICE

BACKGROUND OF THE INVENTION

Field of the Invention

The present invention relates to an electronic tester, and in particular to an alternative current (AC) inrush current testing device and method for testing AC inrush current.

Description of Related Art

An inrush current occurs frequently at the moment when the power of an electrical device (such as power supply unit) starts up. At such a moment, an unpredictable and undesirable transient current happens. This may easily induce a noise, and even the power elements of the electrical device or the load connected to the electrical device could be damaged. Therefore, there is a need to test the greatest inrush current accommodation of the electrical device before being used.

However, the testing result is not reliable while the power capacity of an AC power supply of the testing device is small since the test electrical source generated thereby is smaller than the greatest inrush current. In order to overcome the aforementioned problem, an AC power supply having great power capacity to generate a test electrical source equal to or larger than the greatest inrush current can be used. However, the cost of the testing device is largely increased while the power capacity of the AC power supply is increased. Furthermore, the testing device uses a public alternating current (AC) source as the test electrical source may not be sure whether the power supply meets performance standards since the public AC current is unstable and variable, and the measurement of the magnitude of the tested inrush current is not reliable. The testing device must repeatedly measure the power supply to be sure it can withstand the inrush current without damage. This is a time-consuming and imprecise procedure.

What is needed, therefore, is a testing device for testing the inrush current more precisely and without costly repetition.

SUMMARY OF THE INVENTION

According to one aspect of the present invention, an alternative current (AC) inrush current testing device is arranged between an AC power source and a power supply unit, and is electrically connected to the AC power source and the power supply unit. The AC inrush current testing device includes a grid voltage peak point calculator, a grid voltage period and timing detector, a switch, an autotransformer, and a main relay. The grid voltage period and timing detector is electrically connected to AC power source and the grid voltage peak point calculator. The switch has a movable contact, a first stationary contact, and a second stationary contact, and the movable contact is electrically connected to the AC power source. The autotransformer coupled to the switch includes a first winding, a second winding, and a third winding. One terminal of the first winding is electrically connected to the AC power source, and the other terminal thereof is electrically connected to the first stationary contact and one terminal of the second winding. One terminal of the third winding is electrically connected to the other terminal of the second winding, and the other terminal thereof is electrically connected to the second stationary contact. The main relay is electrically connected to the power supply unit, the grid voltage peak point calculator, the second winding, and the third winding.

The grid voltage period and timing detector detects a potential level of an AC voltage signal outputted from the AC power source and outputs a test signal having zero cross point to the grid voltage peak point calculator. The grid voltage peak point calculator calculates a period of the test signal and sends a trigger signal to the switch at a specific time of the following period for turning on the switch, thus the AC voltage signal is conduct to the power supply unit.

According to another aspect of the present invention, a method for testing AC inrush current includes following steps: (a) detecting potential level of an AC input voltage signal; (b) converting the AC input voltage signal to a test signal, wherein the test signal is composed of a high logic signal and a low logic signal; (c) calculating a period of the high logic signal; and (d) outputting an AC converted signal to the power supply unit at a specific time when the following period of the high logic signal.

The AC inrush current testing device of the present invention includes an autotransformer and a switch coupled to the autotransformer for switching the potential level of the test signal, thus the AC inrush current testing device can output test signal with different potential level to meet different demands. Besides, the grid voltage peak point calculator is configured to calculate the suitable time of outputting the test signal, thus the AC inrush current testing device does not repeatedly measure the power supply unit to be sure it can withstand the inrush current without damage.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

An alternative current (AC) inrush current testing device is configured to test greatest inrush current of a power supply unit. The AC inrush current testing device receives an AC input voltage signal, converts the AC input voltage signal into a test signal, indicates the zero cross point and period of the test signal, and outputs a trigger signal when waveform of the AC input voltage signal reaches a maximum or peak value during positive half cycle measured from the zero baseline. Therefore, the problem of the testing result is not reliable since the testing device has insufficiency power capacity cannot generate test electrical source meeting the condition of greatest inrush current is overcome. Besides, the problem that the testing device needs AC power supply having great power capacity to generate the test electrical source meeting the condition of the greatest inrush current is also overcome.

Furthermore, the AC inrush current testing device of the present invention includes an autotransformer and a switch coupled to the autotransformer for switching the potential level of the test signal, thus the AC inrush current testing device can output test signal with different potential level to meet different demands. The AC inrush current testing device further includes grid voltage peak point calculator for calculating the suitable time of outputting the test signal, thus the AC inrush current testing device does not repeatedly measure the power supply unit to be sure it can withstand the inrush current without damage.

According to the above description of the present invention, the following embodiment is provided for further explanation.

Figure 1:
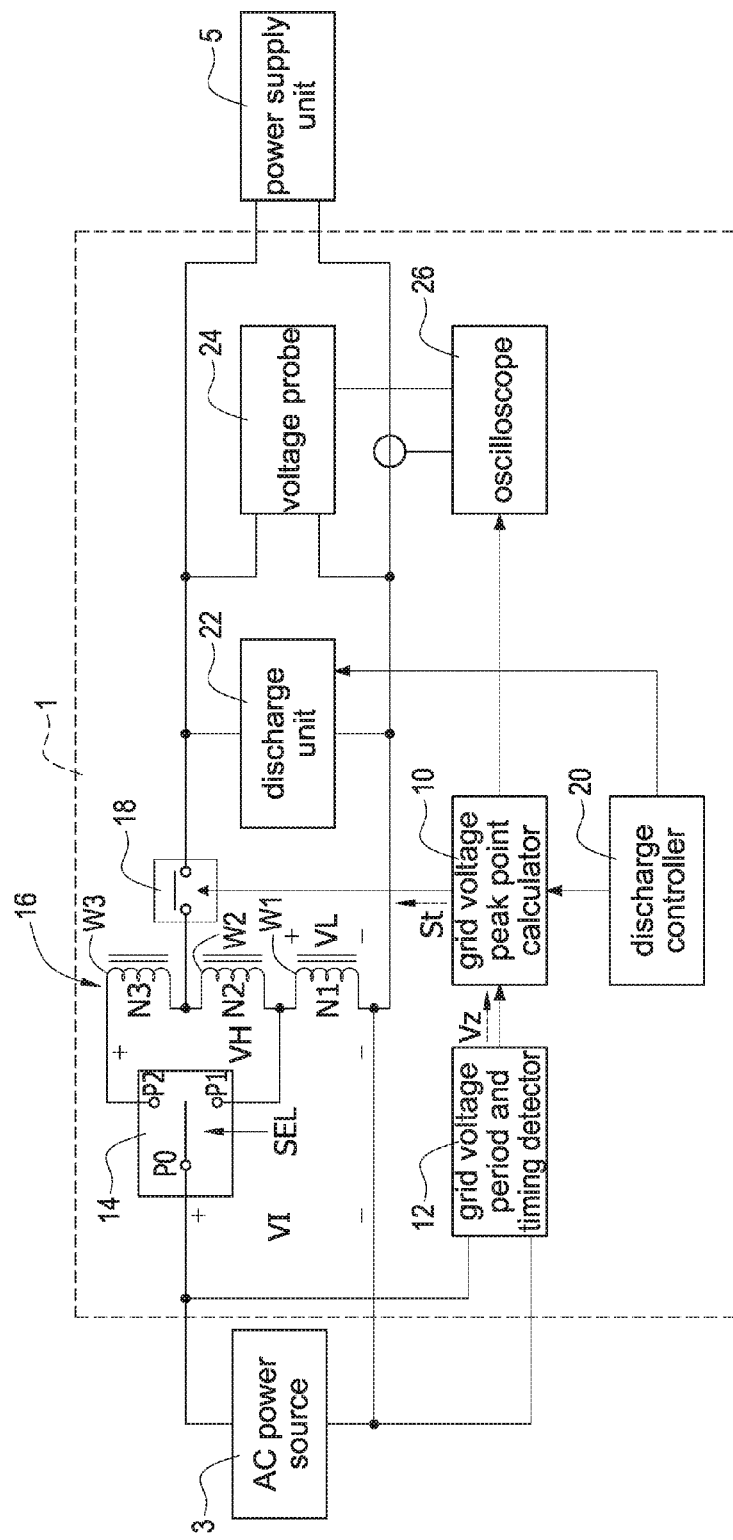
FIG. 1 is a circuit block diagram of an AC inrush current testing device according to an embodiment of the present disclosure.
Figure 3:
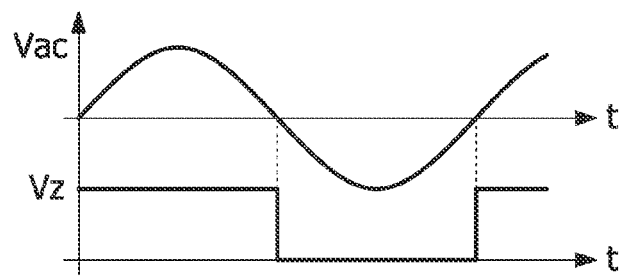
FIG. 3 is a waveform chart illustrating AC voltage signal and sensing signal.

FIG. 1 is a circuit block diagram of an AC inrush current device according to an embodiment of the present invention. In FIG. 1, the AC inrush current testing device 1 is arranged between an AC power source 3 and a power supply unit 5, and is electrically connected to the AC power source 3 and the power supply unit 5. The AC power source 3 is configured to generate an AC input voltage signal Vac varying sinusoidally (as shown in FIG. 3). The AC inrush current testing device 1 includes a grid voltage peak point calculator 10, a grid voltage period and timing detector 12, a switch 14, an autotransformer 16, a main relay 18, a discharge controller 20, a discharge unit 22, a voltage probe 24, and an oscilloscope 26.

The grid voltage period and timing detector 12 is electrically connected to the AC power source 3 and the grid voltage peak point calculator 10. The grid voltage period and timing detector 12 receives the AC input voltage signal Vac and monitors the AC input voltage signal Vac for a zero crossing point. In particular, the grid voltage period and timing detector 12 receives the AC input voltage signal Vac and converts the AC input voltage signal Vac varying sinusoidally to a test signal Vz (as shown in FIG. 3), and then transmitting the test signal Vz to the grid voltage peak point calculator 10.

Figure 2:
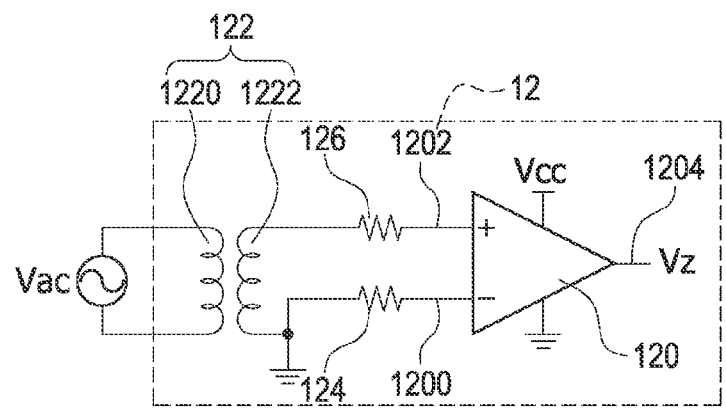
FIG. 2 is a circuit diagram of a grid voltage period and timing detector according to the embodiment the present disclosure.

FIG. 2 is a circuit diagram of a grid voltage period and timing detector according to the embodiment of the present disclosure. In FIG. 2, the grid voltage period and timing detector 12 includes a comparator 120, an isolating transformer 122, a first resistor 124, and a second resistor 126. The comparator 120 has an inverting input 1200, a non-inverting input 1202, and an output 1204. The inverting input 1200 is electrically connected to ground via the first resistor 124, the non-inverting input 1202 is electrically connected to the second resistor 126, and the output 1204 is electrically connected to the grid voltage peak point calculator 10 shown in FIG. 1.

The isolating transformer 122 includes a primary winding 1220 and a secondary winding 1222, and the primary winding 1220 receiving the AC input voltage signal Vac. One terminal of the secondary winding 1222 is electrically connected to the second resistor 126, and the other terminal thereof is electrically to the first resistor 124 and ground.

With refer again to FIG. 1. The switch 14 is coupled between the AC power source 3 and the autotransformer 16. The switching unit 14 shown in FIG. 1 is a single pole double throw (SPDT) relay switch, which includes a movable contact P0, a first stationary contact P1, a second stationary contact P2, and a selecting terminal SEL. The movable contact P0 is electrically connected to the AC power source 3.

The autotransformer 16 includes a plurality of windings electrically connected in series. In FIG. 1, the autotransformer 16 includes, from bottom to top, a first winding W1, a second winding W2, and a third winding W3. One terminal of the first winding W1 is electrically connected to the AC power source 3, and the other terminal of the first winding W1 is electrically connected to one terminal of the second winding W2 and the first stationary contact P1 of the switch 14. One terminal of the third winding W3 is electrically connected to the main relay 18 and the other terminal of the second winding W2, and the other terminal of the third winding W3 is electrically connected to the switch 14 and the second contact P2.

The switch 14 can be selected to modulate potential level of the electric power transmitted to the power supply unit 5. In particular, when the movable contact P0 is selected to be in contact with the first stationary contact P1, the AC power source 3 is transmitted to the power supply unit 5 via the first winding W1, and when the movable contact P0 is selected to be in contact with the second contact P2, the AC power source 3 is transmitted to the power supply unit 5 via the first winding W1, the second winding W2, and the third winding W3. It should be noted that the AC input voltage signal Vac converted by the autotransformer 16 is defined to be AC converted signal.

When a voltage inputted to the autotransformer 16 is VI, a low voltage outputted from the autotransformer 16 (while the movable contact P0 is in contact with the first stationary contact P1) is low voltage VL, a high voltage outputted from the autotransformer 16 (which the movable contact P0 is in contact with the second stationary contact P2) is VH, a ratio of the low voltage outputted form the autotransformer 16 and the voltage inputted to the autotransformer 16 is a, a ratio of the high voltage outputted from the autotransformer 16 and the voltage inputted to the autotransformer 16 is b, a turn number of the first winding W1 is N1, a turn number of the second winding W2 is N2, and a turn number of the third winding W3 is N3, the following conditions are satisfied:

$a=VL/VI;$ $b=VH/VI;$ $N1/N2=1/(b-1);$ and $N1/N3=1/b(1-a),$ where, a<1, and b>1.

The movable contact P0 of the switch 14 is switched between the first stationary contact P1 and the second stationary contact P2 according to a signal entered the selecting terminal SEL. When the movable contact P0 is in contact with the second stationary contact P2, the AC inrush current testing device 1 proceeds a high voltage test, and when the movable contact P0 is in contact with the first stationary contact P1, the AC inrush current testing device 1 proceeds a low voltage test.

The main relay 18 is arranged between the autotransformer 16 and the power supply unit 3, and is electrically connected to the second winding W2, the third winding W3, the power supply unit 3, and the grid voltage peak point calculator 10. The main relay 18 is switched on/off according to a signal outputted form the grid voltage peak point calculator 10. In particular, when the main relay 18 is switched off, there is no electric power conduct to the power supply unit 5. However, when the main relay 18 is switch on, there is an electric power conducts to the power supply unit 5 via the autotransformer 16 and the main relay 18.

The discharge controller 20 is electrically connected to the grid voltage peak point calculator 10 and is configured to output controlling signals for controlling the operation states of the grid voltage peak point calculator 10.

The discharge unit 22 is electrically connected to the AC power source 3, the main relay 18, and the discharge controller 20. The discharge unit 22 is discharged when receives a discharge signal outputted by the discharge controller 20.

The voltage probe 24 is electrically connected to the AC power source 3, the main relay 18, and the oscilloscope 26, and is configured to sense the voltage potential of the AC converted signal and transmit sensed voltage potential to the oscilloscope 26. The voltage probe 24 is also electrically connected to the discharge unit 22 in parallel.

The oscilloscope 26 is electrically connected to the AC power source 3, the grid voltage peak point calculator 10, and the voltage probe 24, and is configured to sensing the potential level of the AC converted signal and loop current flowing through the AC inrush current testing device 1, and shows the waveform of the potential level of the AC converted signal and the loop current.

With referring again to FIG. 2, the grid voltage period and timing detector 3 detects the voltage potential of the AC input voltage signal Vac, when the potential level of the AC input voltage signal Vac is smaller than a predetermined potential level, the output 1204 of the comparator 120 output a test signal Vz with low logic level, and when the potential level of the AC input voltage signal Vac is larger than the predetermined potential level, the output 1204 of the comparator 120 output a test signal Vz with high logic level. In particular, the predetermined potential level is the same as a potential level of the inverting input 1200 of the comparator 120, and is zero.

Thus, when the potential level of the AC input voltage signal Vac is larger than zero (such as the positive half cycle shown in the FIG. 3), the output 1204 of the comparator 120 outputs the test voltage signal Vz with high logic level, and when the potential level of the AC input voltage signal Vac is smaller than zero (such as the negative half cycle shown in the FIG. 3), the output 1204 of the comparator 120 outputs a test voltage Vz with low logic level. In this manner, the zero cross point of the AC input voltage signal Vac is indicated, wherein the zero cross point is at which the AC voltage signal Vac changes from negative to positive and from positive to negative, and at the zero cross point, the potential level the test signal Vz is zero.

The grid voltage peak point calculator 10 receives the test signal Vz outputted from the output 1204 of the comparator 120, and calculates the period of the test signal Vz with high level logic (responding to the positive half cycle of the AC input voltage signal Vac) by a timing signal, wherein the period of the timing signal can be the same as that of the clock signal generated by the grid voltage peak point calculator 10.

Figure 4:
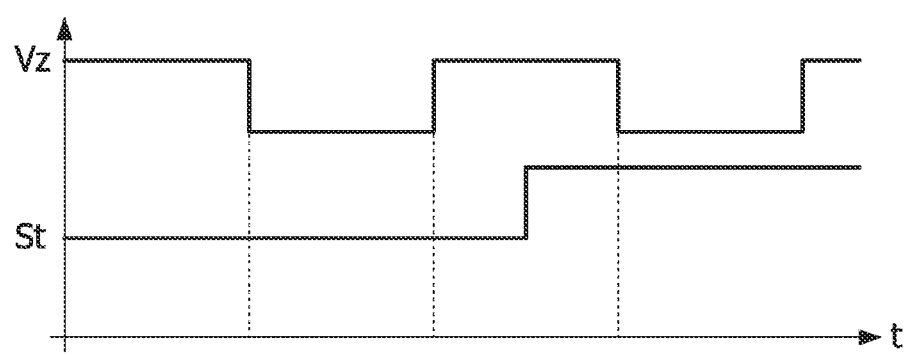
FIG. 4 is a waveform chart illustrating voltage signal and trigger signal.

For pure sinusoidal waveforms the peak value is substantially at the half period of the positive half cycle (or the negative half cycle), and the greatest inrush current is usually occurred when the incoming signal is at the peak value. Thus, a trigger signal St outputted by the grid voltage peak point calculator 10 must make the main relay 18 to turn-on at the half period of the following positive half cycle when the period of the positive half cycle is measured, wherein the waveform of the trigger signal is shown in FIG. 4.

The method for testing AC inrush current of the present invention includes the following steps. At first, the discharging controller 20 makes the discharging unit 22 discharge the remaining electrical energy of the AC inrush current testing device 1. After discharging, the switch 14 is selected to modulate potential level of the AC converter power which is transmitted to the power supply unit 5. In particular, the AC inrush current testing device 1 enters high voltage test while the movable contact P0 is in contact with the second stationary contact P2, and the AC inrush current testing device 1 enters low voltage test while the movable contact P0 is in contact with the first stationary contact P1.

The grid voltage period and timing detector 12 receives the AC input voltage signal Vac and converted the AC input voltage signal Vac into test signal Vz by measure the potential level of the AC input voltage signal Vac, wherein the test signal Vz is composed of high logic signal and low logic signal. After that, the grid voltage peak point calculator 10 calculates the period of one of the high logic signal, and outputs a trigger signal at a specific time of the following high logic signal to conduct the main relay 18 to reach AC inrush current test, wherein the specific time is the half period of the high logic signal of the test signal.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An alternative current (AC) inrush current testing device arranged between an AC power source and a power supply unit and electrically connected to the AC power source and power supply unit, the AC inrush current testing device comprising:
   a grid voltage peak point calculator;
   a grid voltage period and timing detector electrically connected to the AC power source and the grid voltage peak point calculator;
   a switch having a movable contact, a first stationary contact, and a second stationary contact, wherein the movable contact is electrically connected to the AC power source;
   an autotransformer comprising a first winding, a second winding, and a third winding, wherein one terminal of the first winding is electrically connected to the AC power source, and the other terminal of the first winding is electrically connected to the first stationary contact and one terminal of the second winding, one terminal of the third winding is electrically connected to the second stationary contact, and the other terminal of the third winding is electrically connected to the other terminal of the second winding; and
   a main relay electrically connected to the power supply unit, the grid voltage peak point calculator, the second winding, and the third winding,
   wherein the grid voltage period and timing detector detects a potential level of an AC voltage signal outputted from the AC power source and outputs a test signal having zero cross point to the grid voltage peak point calculator, the grid voltage peak point calculator calculates a period of the test signal and sends a trigger signal to the main relay at a specific time of the following period for turning on the switch, thus the AC voltage signal is conduct to the power supply unit.

2. The AC inrush current testing device in claim 1, wherein the specific time is at the half period of the positive half cycle of the test signal.

3. The AC inrush current testing device in claim 1, wherein a voltage inputted to the autotransformer is VI, a low voltage outputted from the autotransformer is VL, a high voltage output from the autotransformer is VH, a ratio between the low voltage outputted from the autotransformer and the voltage inputted to the autotransformer is a, a ratio between the high voltage outputted from the autotransformer and the voltage inputted to the autotransformer is b, a turn number of the first winding is N1, a turn number of the second winding is N2, and a turn number of the third winding is N3, the following conditions are satisfied:

$$a=VL/VI;$$

$$b=VH/VI;$$

$$N1/N2=1/(b-1); \text{ and}$$

$$N1/N3=1/b(1-a).$$

4. The AC inrush current testing device in claim 1, wherein the grid voltage period and timing detector comprising:

an isolating transformer comprising a primary winding and a secondary winding coupled to each other, wherein the primary winding is electrically connected to the AC power source;

a comparator having an inverting input, a non-inverting input, and an output, wherein the output is electrically connected to the grid voltage peak point calculator;

a first resistor electrically connected to the inverting input and the secondary winding; and a second resistor electrically connected to the non-inverting input and the secondary winding.

5. The AC inrush current testing device in claim 1, further comprising a discharge unit electrically connected to the AC power source and the main relay.

6. The AC inrush current testing device in claim 5, further comprising:

a voltage probe electrically connected to the AC power source and the main relay; and an oscilloscope electrically connected to the AC power source, the grid voltage peak point calculator, and the voltage-sensing unit.

7. The AC inrush current testing device in claim 6, wherein the voltage probe is electrically connected to the discharge unit in parallel.

* * * * *